(12) United States Patent
Lee et al.

(10) Patent No.: US 10,273,395 B2
(45) Date of Patent: Apr. 30, 2019

(54) HEAT DISCHARGING SHEET AND METHOD FOR MANUFACTURING THE SAME

(71) Applicant: LG ELECTRONICS INC., Seoul (KR)

(72) Inventors: Dongwook Lee, Seoul (KR); Nami Byun, Seoul (KR); Sungguk Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 166 days.

(21) Appl. No.: 14/779,507

(22) PCT Filed: Jun. 19, 2014

(86) PCT No.: PCT/KR2014/005420
§ 371 (c)(1),
(2) Date: Sep. 23, 2015

(87) PCT Pub. No.: WO2014/208930
PCT Pub. Date: Dec. 31, 2014

(65) Prior Publication Data
US 2016/0053155 A1  Feb. 25, 2016

(30) Foreign Application Priority Data

Jun. 26, 2013 (KR) .................. 10-2013-0073723
Jun. 28, 2013 (KR) .................. 10-2013-0075729
(Continued)

(51) Int. Cl.
*C09K 5/14* (2006.01)
*B05D 3/12* (2006.01)
*H01L 23/373* (2006.01)

(52) U.S. Cl.
CPC ............. *C09K 5/14* (2013.01); *B05D 3/12* (2013.01); *H01L 23/373* (2013.01);
(Continued)

(58) Field of Classification Search
CPC .................................................. H01L 23/3737
See application file for complete search history.

(56) References Cited

U.S. PATENT DOCUMENTS 6,086,994 A * 7/2000 Oura ............... C09J 7/0246
156/332
2003/0152764 A1* 8/2003 Bunyan ............. C09K 5/063
428/328

(Continued)

FOREIGN PATENT DOCUMENTS

JP    10168502 A  *  6/1998
JP    10-1043346 B1    6/2011
(Continued)

*Primary Examiner* — Alexandre F Ferre
(74) *Attorney, Agent, or Firm* — Birch, Stewart, Kolasch & Birch, LLP

(57) ABSTRACT

A heat discharging sheet using graphene and a method for manufacturing the same are disclosed. The heat discharging sheet includes a heat discharging layer having a first surface and a second surface, the heat discharging layer including graphene and metal particles, an adhesive layer disposed on a first surface of the heat discharging layer, and a protective layer disposed on a second surface of the heat discharging layer.

14 Claims, 17 Drawing Sheets

(30)  Foreign Application Priority Data

Jun. 28, 2013 (KR) .......................... 10-2013-0075730
Jul. 4, 2013 (KR) .......................... 10-2013-0078355
Jul. 4, 2013 (KR) .......................... 10-2013-0078356

(52) U.S. Cl.
 CPC ...... *H01L 23/3736* (2013.01); *H01L 23/3735* (2013.01); *H01L 23/3737* (2013.01); *H01L 2924/0002* (2013.01)

(56) References Cited

U.S. PATENT DOCUMENTS

| | | |
|---|---|---|
| 2005/0228097 A1 | 10/2005 | Zhong |
| 2010/0296253 A1 | 11/2010 | Miyamoto et al. |
| 2011/0040007 A1* | 2/2011 | Chandrasekhar ........ H01B 1/22 524/404 |
| 2011/0256014 A1* | 10/2011 | Hong ................... C22C 1/0425 419/11 |
| 2014/0090708 A1 | 4/2014 | Kang et al. |

FOREIGN PATENT DOCUMENTS

| | | |
|---|---|---|
| JP | 5146402 B2 | 2/2013 |
| JP | 5151447 B2 | 2/2013 |
| KR | 10-2012-0129789 A | 11/2012 |

\* cited by examiner

HEAT DISCHARGING SHEET AND METHOD FOR MANUFACTURING THE SAME

CROSS REFERENCE TO RELATED APPLICATIONS

This application is the National Phase of PCT International Application No. PCT/KR2014/005420, filed on Jun. 19, 2014, which claims priority under 35 U.S.C. 119(a) to Patent Application No. 10-2013-0073723, filed in the Republic of Korea on Jun. 26, 2013, Patent Application No. 10-2013-0075729, filed in the Republic of Korea on Jun. 28, 2013, Patent Application No. 10-2013-0075730, filed in the Republic of Korea on Jun. 28, 2013, Patent Application No. 10-2013-0078355, filed in the Republic of Korea on Jul. 4, 2013, and Patent Application No. 10-2013-0078356, filed in the Republic of Korea on Jun. 4, 2013, all of which are hereby expressly incorporated by reference into the present application.

TECHNICAL FIELD

The present invention relates to a heat discharging sheet and more specifically, to a heat discharging sheet using graphene and a method for manufacturing the same.

BACKGROUND ART

Substances containing carbon atoms include fullerene, carbon nanotube, graphene and graphite. Of these, graphene is a single atom layer whose structure is a two-dimensional planar array of carbon atoms.

In particular, graphene has considerably stable and superior electrical, mechanical and chemical properties and has excellent conductivity and thus more rapidly carries electrons than silicon and enables application of higher electrical current than copper, which was demonstrated through experimentation based on discovery of a method of separating graphene from graphite in 2004 and graphene has been actively researched to date.

Such graphene attracts much attention as a base material for electrical circuits because it may be produced at a large scale and have excellent conductivity as well as electrical, mechanical and chemical stability.

In addition, electrical properties of graphene may change according to crystal direction of graphene with a predetermined thickness. For this reason, electrical properties are expressed in a direction selected by a user and devices can thus be easily designed. Accordingly, graphene is effectively used for carbon-based electronic or electromagnetic devices.

As such, graphene may be applied to heat discharge materials due to superior thermal conductivity.

DISCLOSURE

Technical Problem

One object of the present invention devised to solve the problem lies on a heat discharging sheet which effectively transfers heat generated by a heat source and then discharges the heat and a method for manufacturing the same.

In addition, another object of the present invention devised to solve the problem lies on a heat discharging sheet which improves thermal conductivity in a vertical direction and a method for manufacturing the same.

Technical Solution

The object of the present invention can be achieved by providing a heat discharging sheet including a heat discharging layer having a first surface and a second surface, the heat discharging layer including graphene and metal particles, an adhesive layer disposed on a first surface of the heat discharging layer, and a protective layer disposed on a second surface of the heat discharging layer.

The graphene has a two-dimensional layered structure, and the metal particles are disposed between the layers of the graphene.

The metal particles may be present in an amount of 0.5 to 50% by weight and the graphene may be present in an amount of 50 to 99.5% by weight.

The metal particles may include at least one of copper (Cu), silver (Ag), aluminum (Al) and gold (Au).

The metal particles may improve thermal conductivity in a vertical direction of the heat discharging sheet.

At least one of the adhesive layer and the protective layer may include a thermally conductive material.

The thermally conductive material may include at least one of Cu, Al, BN, AiN, $Al_2O_3$, MgO and carbon nanotubes (CNTs).

The thermally conductive material may be present in an amount of 10 to 90% by weight in the adhesive layer or the protective layer.

At least one of the adhesive layer and the protective layer may include a polymer material.

At least one of the adhesive layer and the protective layer may have a thickness of 5 to 20 μm.

In another aspect of the present invention, provided herein is a method for manufacturing a heat discharging sheet including preparing metal particles and a graphene material, dispersing the metal particles and the graphene material in a solution to prepare a dispersion, and drying the dispersion and then rolling the dried dispersion to produce a heat discharging layer.

The drying of the dispersion may include filtering the dispersion using a sieve.

The production of the heat discharging layer may include coating the dispersion on a substrate, drying the coating, and rolling the coating and the substrate.

The method may further include, after the production of the heat discharging layer, forming an adhesive layer on a side of the heat discharging layer and forming a protective layer on another side of the heat discharging layer.

At least one of the adhesive layer and the protective layer may be made of a polymer material.

At least one of the adhesive layer and the protective layer may be made of a thermally conductive material.

The thermally conductive material may include at least one of Cu, Al, BN, AiN, $Al_2O_3$, MgO and carbon nanotubes (CNTs).

The thermally conductive material may be present in an amount of 10 to 90% by weight in the adhesive layer or the protective layer.

At least one of the adhesive layer and the protective layer may have a thickness of 5 to 20 μm.

The metal particles may be present in an amount of 0.5 to 50% by weight and the graphene may be present in an amount of 50 to 99.5% by weight.

Advantageous Effects

First, the heat discharging sheet according to the present invention is attached to a heat source and thus effectively discharges heat generated by the heat source.

Specifically, the heat discharging layer included in the heat discharging sheet is attached to the heat source through an adhesive layer and discharges heat generated by the heat source. In this case, the adhesive layer is attached to the heat source and transfers heat generated by the heat source to the heat discharging layer.

The heat discharging layer can discharge heat, in particular, in a lateral direction, thus more effectively discharging the heat generated by the heat source.

The graphene included in the heat discharging layer has superior heat conduction in a horizontal direction and particles mediating heat or particles reinforcing strength, which are disposed between respective layers of graphene, are connected to enable heat conduction through respective layers of graphene.

Accordingly, horizontal and vertical directions of thermal conductivity can be greatly improved.

Technical effects accomplished by the present invention are not limited to those described above and those skilled in the art will clearly understand other technical effects not described herein from the following disclosure.

DESCRIPTION OF DRAWINGS

The accompanying drawings, which are included to provide a further understanding of the invention, illustrate embodiments of the invention and together with the description serve to explain the principle of the invention.

In the drawings.

BEST MODE

Figure 1:
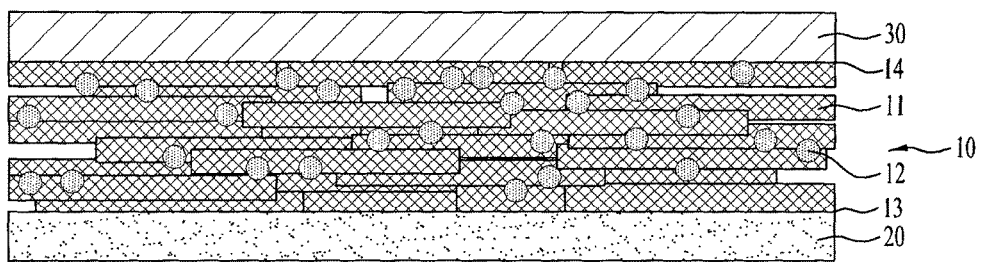
FIGS. 1 to 8 illustrate a first embodiment according to the present invention.

Reference will now be made in detail to the specific embodiments of the present invention, examples of which are illustrated in the accompanying drawings.

However, the present invention allows various modifications and variations and specific embodiments thereof are described in drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area, or substrate is referred to as being "on" another element, it can be directly on the element, or one or more intervening elements may also be present.

In addition, it will be understood that although terms such as "first" and "second" may be used herein to describe elements, components, areas, layers and/or regions, the elements, components, areas, layers and/or regions should not be limited by these terms.

In the description of a manufacturing method, the respective steps may be performed in order as shown in reference drawings, but may be simultaneously performed or performed in order different from that shown in the drawings.

Hereinafter, a variety of embodiments will be described, but features of the embodiments may be combined and features omitted in the corresponding embodiment may be reinforced in other embodiments.

First Embodiment

FIG. 1 is a sectional view illustrating a heat discharging sheet according to a first embodiment.

As shown in FIG. 1, the heat discharging sheet 100 includes a heat discharging layer 10 having a first surface 13 and a second surface 14. The heat discharging layer 10 includes a graphene 11 and metal particles 12.

The graphene 11 has a two-dimensional layered structure and the metal particles 12 are distributed between layers of the graphene 11 and mediate heat conduction through the respective layers of the graphene 11. Accordingly, the metal particles 12 may be distributed between the layers of the graphene 11.

The heat discharging layer 10 generally has heat conduction property and thus uses, as a main material, the graphene 11 with superior thermal conductivity. The graphene 11 exhibits superior thermal conductivity, but as described above, graphene has a layered anisotropic arrangement, and thus has superior thermal conductivity in a horizontal direction, but low thermal conductivity in a vertical direction. However, metal particles 12 having isotropic thermal conductivity are distributed between the layers of the graphene 11 and improve thermal conductivity in a vertical direction.

For such a feature, the metal particles 12 may have a content of 0.5 to 50% by weight and the graphene 11 may have a content of 50 to 99.5% by weight.

The heat discharging layer 10 may have a thickness of 5 to 100 μm. In order to obtain this thickness, a plurality of layers of graphene 11 are stacked and metal particles 12 are distributed between the layers of the graphene 11.

Meanwhile, an adhesive layer 20 attached to a heat source (200; see FIG. 3) may be disposed on the first surface 13 of the heat discharging layer 10. Such an adhesive layer 20 functions to enhance attachment of the heat discharging layer 10 to the heat source, to minimize the distance between the first surface 13 and the heat source and to effectively transfer heat generated in the heat source to the heat discharging layer 10.

A polymer-based material may be used as a matrix of the adhesive layer 20, but the present invention is not limited thereto. When a polymer material is used as the matrix of the adhesive layer 20, a variety of polymer resins such as a polyurethane resin, an epoxy resin, an acrylic resin and a polymer resin may be used.

The adhesive layer 20 may have a thickness of several tens of nanometers to several hundreds of micrometers and may have a thickness of 5 to 100 μm for effective discharge of heat and adhesion to the heat source.

More specifically, when the adhesive layer 20 has a thickness of 5 to 20 μm, optimal effects can be exerted.

In addition, a protective layer 30 for protecting the heat discharging layer 10 may be disposed on the second surface 14 of the heat discharging layer 10. The protective layer 30 may be formed by coating on the heat discharging layer 10 to prevent detachment of a material constituting the heat discharging layer 10. However, the protective layer 30 may improve heat discharge property, in addition to serving the anti-detachment function. In addition, in some cases, the protective layer 30 may improve insulation. That is, the protective layer 30 effectively discharges heat transferred through the heat discharging layer 10. The protective layer 30 may be made of a polymer-based material, but the present invention is not limited thereto.

When a polymer material is used as the protective layer 30, a variety of polymer resins such as a polyurethane resin, an epoxy resin, an acrylic resin, a polymer resin, PET and PT may be used.

The protective layer 30 may have a thickness ranging from several tens of nanometers to several hundreds of micrometers in consideration of protection of the heat discharging layer 10 and discharge of heat to the outside. The protective layer 30 may have a thickness of 5 to 100 µm for effective discharge of heat and adhesion to the heat source. More specifically, the protective layer 30 can exert optimal effects when it has a thickness of 5 to 20 µm.

Figure 2:
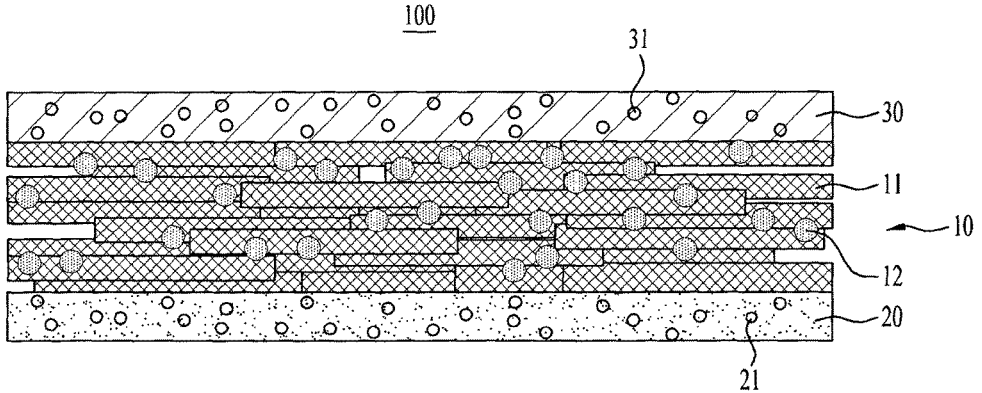

Meanwhile, as shown in FIG. 2, for improvement of heat conduction, thermally conductive materials 21 and 31 may be contained in at least one of the adhesive layer 20 and the protective layer 30.

When the thermally conductive material 21 is contained in the adhesive layer 20, heat generated in the heat source can be more effectively transferred through the adhesive layer 20 to the heat discharging layer 10. The thermally conductive material 21 may include at least one of graphene, an inorganic material, a metal and graphite.

More specifically, in addition to graphene, the thermally conductive material 21 may include a metal such as Cu and Al, an inorganic material such as BN, AiN, $Al_2O_3$ and MgO, or graphite and may further include carbon nanotubes (CNTs).

As such, when the thermally conductive material 21 is contained in the adhesive layer 20, the thermally conductive material 21 may be present in an amount of 10 to 90% by weight, based on 100% by weight of the polymer material constituting the adhesive layer 20.

In addition, the protective layer 30 may also include a thermally conductive material 31. The thermally conductive material 31 can further improve thermal conductivity through the protective layer 30. Accordingly, the thermally conductive material 31 contained in the protective layer 30 enables heat to be more effectively discharged to the outside through the protective layer 20 or to be exchanged with the outside. The thermally conductive material 31 may have the same properties as the conduction material 21 contained in the adhesive layer 20.

Figure 3:
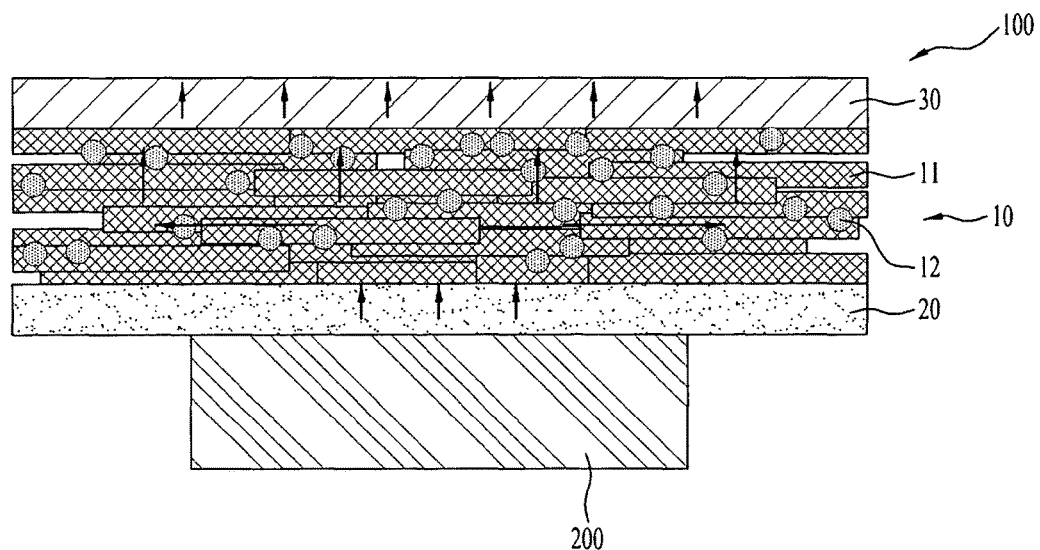

FIG. 3 schematically shows discharge of heat by a heat discharging sheet attached to a heat source. As described above, the heat discharging sheet 100 is attached to the heat source 200 and effectively discharges heat generated by the heat source 200.

The heat discharging layer 10 including the graphene 11 and the metal particles 12 is attached to the heat source 200 and discharges heat generated by the heat source 200. In this case, the adhesive layer 20 is attached to the heat source 200 and effectively transfers heat generated by the heat source 200 to the heat discharging layer 10.

As described above, the graphene 11 is composed of carbon atoms having a hexagonal single layer and is rich in π-electrons in the plane and has superior thermal conductivity and electrical conductivity.

The graphene 11 has a considerably high thermal conductivity of about 3,000 to about 5,000 W/mK and thus effectively discharges heat transferred from the heat source through the heat discharging layer 10, in particular, in a lateral direction.

The graphene 11 is produced by stacking a powder obtained from graphene oxide and compressing the powder, and thus has an anisotropic arrangement and has considerably high thermal conductivity in a horizontal direction of 300 to 1,000 W/mK, but has a relatively low thermal conductivity (2 to 5 W/mk) in a vertical direction.

In this case, the metal particles 12 disposed between the graphenes 11 may be connected to the graphenes 11 to enable heat conduction through the respective layers of the graphene 11. Accordingly, thermal conductivity in a vertical direction can be greatly improved.

The connection of the metal particles 12 to the graphenes 11 enables an increase in thermal conductivity in a vertical direction to about several to about several hundred W/mK.

The metal particles 12 may include copper (Cu), silver (Ag), aluminum (Al), gold (Au) or the like, but the present invention is not limited thereto.

The size of the metal particles 12 is adjusted to several tens of nanometers (nm) to several hundreds of micrometers (µm) by, for example, grinding the corresponding metal.

The metal particles 12 may any shape including spherical, plate and amorphous shapes.

Meanwhile, as described above, when the adhesive layer 20 contains the heat transfer material 21, heat generated by the heat source 200 can be more effectively transferred to the heat discharging layer 10 due to superior thermal conductivity of the heat transfer material 21.

The heat discharging layer 10 can discharge heat, in particular, in a lateral direction and can thus more effectively discharge heat generated by the heat source 200. In this case, the heat transferred to the protective layer 30 may be discharged to the outside through the protective layer 30.

In addition, when the heat transfer material 31 is contained in the protective layer 30, heat can be effectively discharged through the protective layer 30 due to superior thermal conductivity of the heat transfer material 31. In addition, heat exchange with the outdoor air through the protective layer 30 may also proceed.

Commonly, the adhesive layer 20 and the protective layer 30 contain an oxide filler for improvement of thermal conductivity, but the oxide filler should be contained in a large amount in order to improve the thermal conductivity to a predetermined level due to great weight and low thermal conductivity and is disadvantageously difficult to apply to products having a thickness of about several to about several tens of micrometers.

However, the adhesive layer 20 or the protective layer 30 including the heat transfer materials 21 and 31 can more effectively transfer or discharge heat without these problems.

Figure 4:
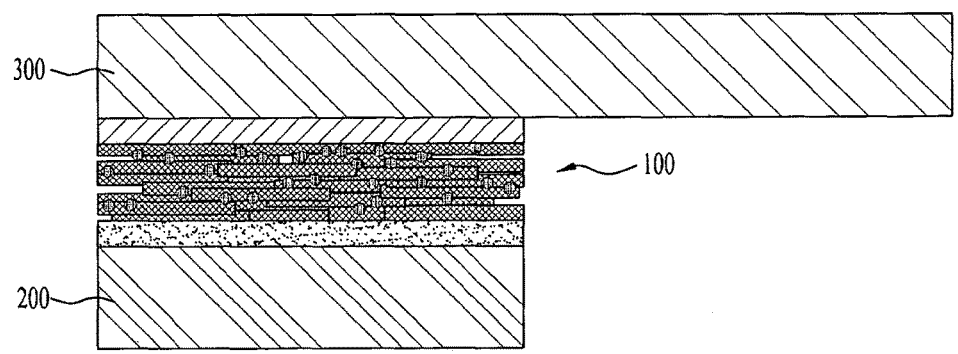

FIG. 4 shows an example of use of the heat discharging sheet and an example in which the heat discharging sheet 100 is used for application products such as TVs using flat panel displays.

As shown in FIG. 4, the heat discharging sheet 100 is adhered to the driving unit 200 as the heat source and the display panel 300 is disposed on the heat discharging sheet 100.

In accordance with the configuration shown in FIG. 4, heat is discharged from the heat discharging sheet 10 in a lateral direction, not a direction of the display panel 300. The heat discharged from the display panel 300 may also be discharged through the heat discharging sheet 100.

Meanwhile, the heat discharging sheet 100 may be attached to and used for any heat-generating element such as a solar cell and a light-emitting diode lighting device.

For example, the heat discharging sheet 100 may be attached to and used for a lower buffer member opposite to a light-receiving unit of solar cells and the heat discharging sheet 100 may be attached to and used for a heat sink of the light-emitting diode lighting.

As such, the heat discharging layer 10 of the heat discharging sheet 100 including the graphene 11 and the metal particles 12 may be produced using a dispersion containing the metal particles 12 and the graphene material.

Hereinafter, a method for manufacturing the heat discharging layer 10 of the heat discharging sheet 100 will be described in detail with reference to FIGS. 5 to 8.

Figure 5:
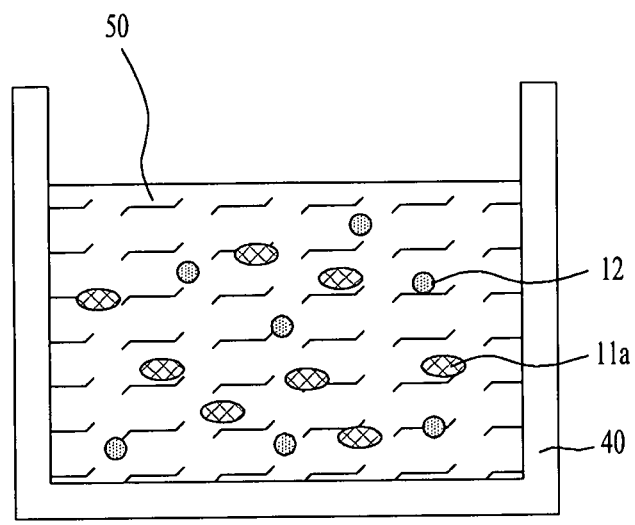

First, as shown in FIG. 5, a graphene material 11a and metal particles 12 are prepared and are then dispersed in a solution contained in a container to prepare a dispersion 50.

As described above, the graphene material 11a may be prepared by reducing graphene oxide. The graphene oxide refers to a carbon particle oxidized with an acid. Graphene oxide may be produced by oxidizing graphite with a strong acid such as sulfuric acid. If necessary, a mixture of sulfuric acid with hydrogen peroxide may be used for oxidization.

Graphite has a sheet structure and is oxidized when a strong acid is added thereto. Graphene oxide is obtained by chemically processing such graphite into small particles. Graphene oxide effectively transfers heat generated by the heat source because it has non-conductivity not allowing for flow of electricity and thermal conductivity of several tens of W/mK. As described above, the graphene oxide may be produced into the graphene material 11a by reduction.

Meanwhile, the graphene material 11a or the metal particles 12 may be used as the heat transfer materials 21 and 31 contained in the adhesive layer 20 and the protective layer 30.

Next, the dispersion 50 in which the graphene material 11a and the metal particles 12 thus produced are dispersed is dried and rolled to produce a heat discharging layer 10.

A process of producing a film by drying the dispersion 50 may be carried out by two methods as described below.

Figure 6:
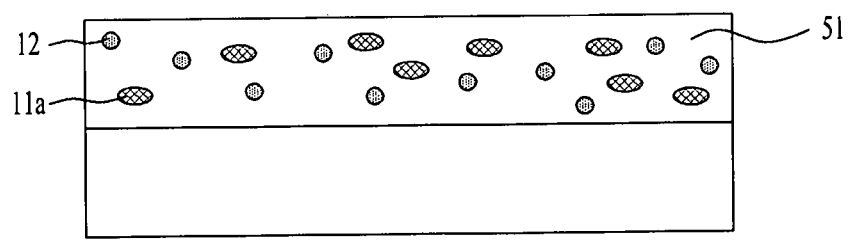

First, as shown in FIG. 6, the dispersion in which the graphene material 11a and metal particles 12 thus produced are dispersed is coated on a substrate 60 to produce a film 51.

Figure 7:
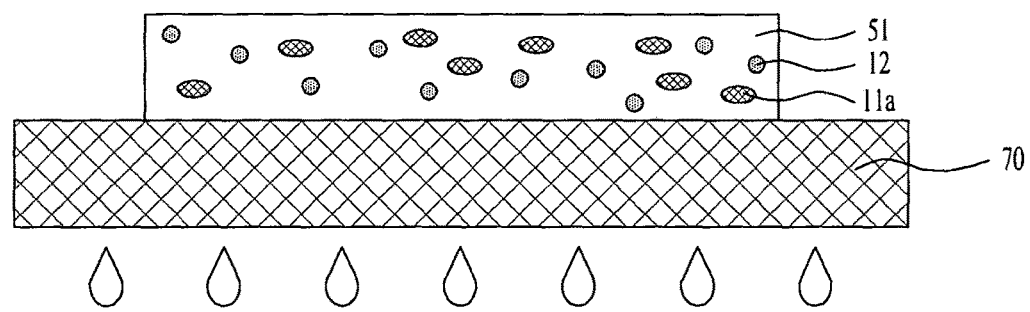

In the other method, as shown in FIG. 7, the film 51 may be produced by filtering the dispersion, in which the graphene material 11a and the metal particles 12 are dispersed, using a sieve 70.

Figure 8:
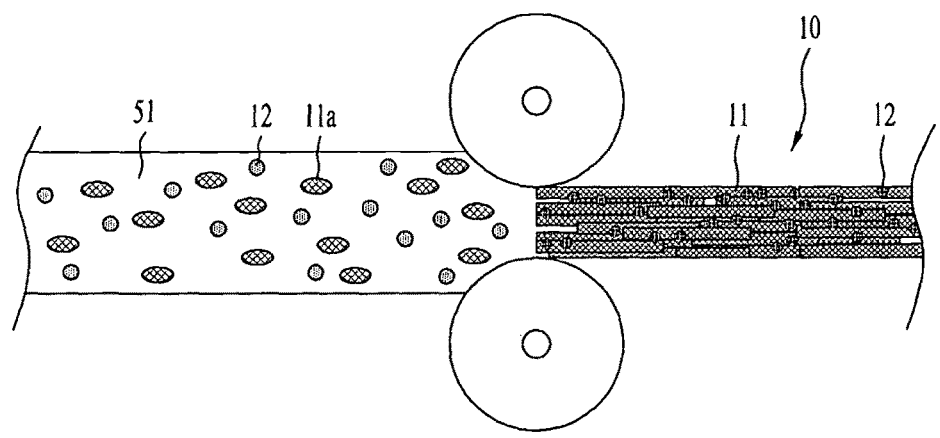

As such, after production of the film 51 using the dispersion 50, as shown in FIG. 8, the film 51 is rolled using a pair of rollers to produce a heat discharging layer 10.

In the rolling process, the graphene material 11a is mixed with the metal particles 12 to form a structure in which the metal particles 12 are dispersed between multilayers of the graphene 11 such that the metal particles 12 connect the multilayers.

An adhesive layer 20 and a protective layer 30 are attached to or directly formed on the first surface and the second surface, respectively, of the heat discharging layer 10 thus produced, to manufacture the heat discharging sheet 100, as shown in FIG. 1.

Second Embodiment

Figure 9:
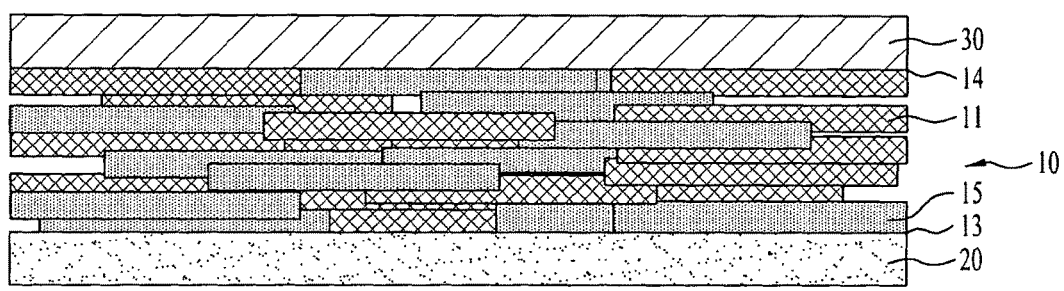
FIGS. 9 to 16 illustrate a second embodiment according to the present invention.

FIG. 9 is a sectional view illustrating a heat discharging sheet according to a second embodiment.

As shown in FIG. 9, the heat discharging sheet 100 includes a heat discharging layer 10 having a first surface 13 and a second surface 14. The heat discharging layer 10 may transfer or discharge heat.

The heat discharging layer 10 may include a graphene 11 and boron nitride 15. In particular, the boron nitride 15 may include hexagonal boron nitride (h-BN). The hexagonal boron nitride 15 has a hexagonal crystal structure on a two-dimensional plane similar to the graphene 11. Accordingly, the graphene 11 and the boron nitride 15 may have a layered structure. Thus, the heat discharging layer 10 has a structure in which the graphene 11 and the boron nitride 15, each having a layered structure, are stacked and in particular, are generally irregularly stacked.

In this case, the heat discharging layer 10 generally has thermal conductivity and thus uses the graphene 11 having superior thermal conductivity as a main material. In addition, the boron nitride 15 can impart electrical conductivity to the heat discharging layer 10 without great deterioration in thermal conductivity. For this purpose, the content of the boron nitride 15 may be 1 to 95% by weight and the content of the graphene 11 may be 5 to 99% by weight.

The heat discharging layer 10 may have a thickness of 5 to 100 μm. The graphene 11 and the boron nitride 15 may be stacked to accomplish this thickness.

Meanwhile, an adhesive layer 20 attached to a heat source (200; see FIG. 3) may be disposed on the first surface 13 of the heat discharging layer 10. Such an adhesive layer 20 functions to enhance attachment of the heat discharging layer 10 to the heat source, to minimize the distance between the first surface 13 and the heat source and to effectively transfer heat generated in the heat source to the heat discharging layer 10.

A polymer-based material may be used as a matrix of the adhesive layer 20, but the present invention is not limited thereto. When a polymer material is used as the matrix of the adhesive layer 20, a variety of polymer resins such as a polyurethane resin, an epoxy resin, an acrylic resin and a polymer resin may be used.

The adhesive layer 20 may have a thickness of several tens of nanometers to several hundreds of micrometers and may have a thickness of 5 to 100 μm for effective discharge of heat and adhesion to the heat source.

More specifically, when the adhesive layer 20 has a thickness of 5 to 20 μm, optimal effects can be exerted.

In addition, a protective layer 30 for protecting the heat discharging layer 10 may be disposed on the second surface 14 of the heat discharging layer 10. The protective layer 30 may be formed on heat discharging layer 10 by coating to prevent detachment of a material constituting the heat discharging layer 10. However, the protective layer 30 may improve heat discharge property, in addition to serving the anti-detachment function. In addition, in some cases, the protective layer 30 may improve insulation. That is, the protective layer 30 effectively discharges heat transferred through the heat discharging layer 10.

The protective layer 30 may be made of a polymer-based material, but the present invention is not limited thereto.

When a polymer material is used for the protective layer 30, a variety of polymer resins such as a polyurethane resin, an epoxy resin, an acrylic resin, a polymer resin, PET and PT may be used.

The protective layer 30 may have a thickness ranging from several tens of nanometers to several hundreds of micrometers in consideration of protection of the heat discharging layer 10 and discharge of heat to the outside. The protective layer 30 may have a thickness of 5 to 100 μm for effective discharge of heat and adhesion to the heat source. More specifically, the protective layer 30 can exert optimal effects when it has a thickness of 5 to 20 μm.

Figure 10:
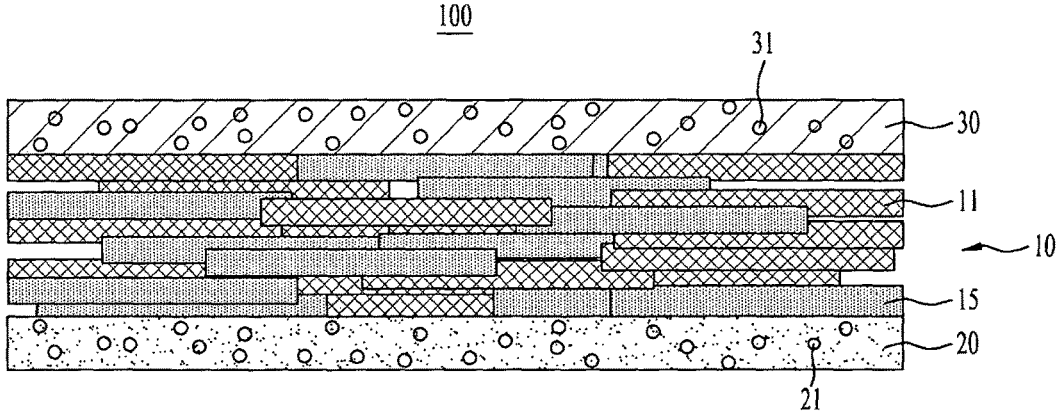

Meanwhile, as shown in FIG. 10, for improvement of heat conduction, a thermally conductive material 21 or 31 may be contained in at least one of the adhesive layer 20 and the protective layer 30. The characteristics of the conduction materials 21 and 31 are the same as those of the embodiment described above.

Figure 11:
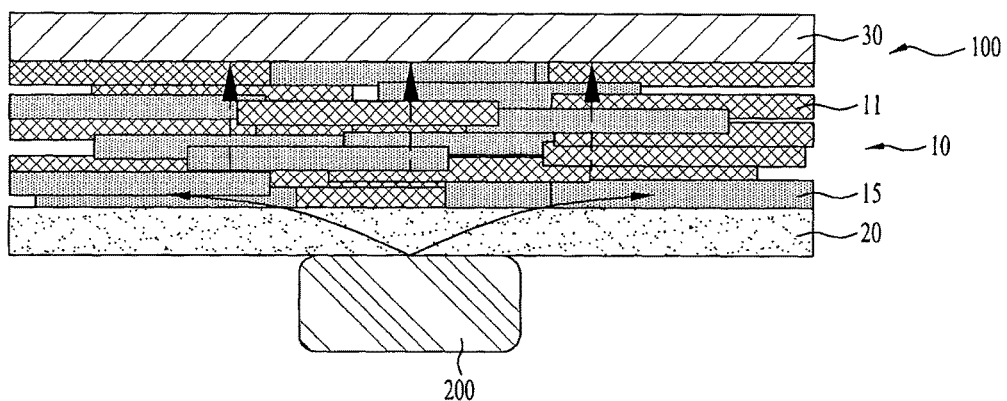

FIG. 11 schematically shows discharge of heat by a heat discharging sheet attached to a heat source. As described above, the heat discharging sheet 100 is attached to the heat source 200 and effectively discharges heat generated by the heat source 200.

The heat discharging layer 10 including the graphene 11 and the boron nitride 15 is attached to the heat source 200 and discharges heat generated by the heat source 200. In this case, the adhesive layer 20 is attached to the heat source 200 and effectively transfers heat generated by the heat source 200 to the heat discharging layer 10.

As described above, the graphene 11 is composed of carbon atoms having a hexagonal single layer and discharges heat transferred from the heat source through the heat discharging layer, in particular, in a lateral direction.

However, use of the graphene 11 for products requiring insulation may be limited due to non-insulation of the graphene 11. To solve this problem, insulation can be secured by adding boron nitride (BN) 12 which is a layered substance having a similar structure to the boron nitride 15.

When the boron nitride 12 is mixed with the graphene 11, connection of the graphene 11 is inhibited and electrical conductivity can be thus secured. In addition, although the boron nitride 15 is added, the total thermal conductivity of the heat discharging layer 10 is greatly not changed because the boron nitride 15 has a high horizontal thermal conductivity of about 700 W/mK.

Meanwhile, as described above, when the adhesive layer 20 contains the heat transfer material 21, heat generated by the heat source 200 can be more effectively transferred to the heat discharging layer 10 due to superior thermal conductivity of the heat transfer material 21.

The heat discharging layer 10 can discharge heat, in particular, in a lateral direction and can thus more effectively discharge heat generated by the heat source 200. In this case, the heat transferred to the protective layer 30 may be discharged to the outside through the protective layer 30. In addition, when the heat transfer material 31 is contained in the protective layer 30, heat can be effectively discharged through the protective layer 30 due to superior thermal conductivity of the heat transfer material 31. In addition, heat exchange with the exterior air through the protective layer 30 may also proceed.

Commonly, the adhesive layer 20a and the protective layer 30 contain an oxide filler for improvement of thermal conductivity, but the oxide filler should be contained in a large amount in order to improve the thermal conductivity to a predetermined level due to great weight and low thermal conductivity and is disadvantageously difficult to apply to products having a thickness of about several to about several tens of micrometers.

However, the adhesive layer 20 or the protective layer 30 including the heat transfer material 21 or 31 can more effectively transfer or discharge heat without causing this problem.

Figure 12:
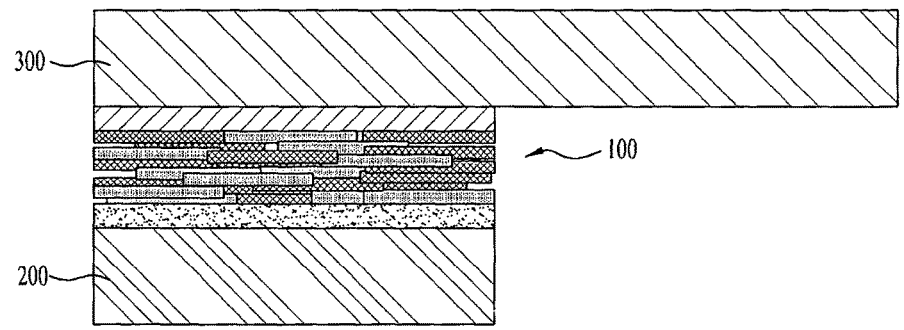

FIG. 12 shows an example of use of the heat discharging sheet and an example in which the heat discharging sheet 100 is used for application products such as TVs using flat panel displays.

Meanwhile, the heat discharging sheet 100 may be adhered to and used for any heat-generating element such as a solar cell and a light-emitting diode lighting device. For example, the heat discharging sheet 100 may be adhered to and used for a lower buffer member opposite to a light-receiving unit of solar cells and the heat discharging sheet 100 may be adhered to and used for a heat sink of the light-emitting diode lighting.

As such, the heat discharging layer 10 of the heat discharging sheet 100 including the graphene 11 and the boron nitride 15 may be produced using a dispersion solution containing the boron nitride 15 and the graphene material.

Hereinafter, a method for manufacturing the heat discharging layer 10 of the heat discharging sheet 100 will be described in detail with reference to FIGS. 13 to 16.

Figure 13:
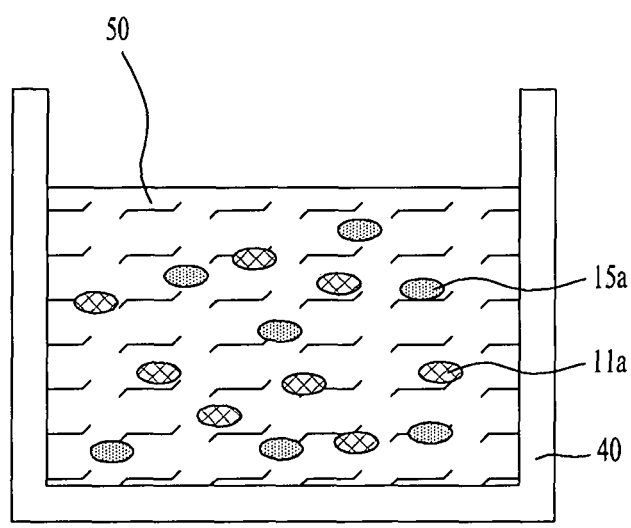

First, as shown in FIG. 13, a graphene material 11a and a boron nitride material 15a are prepared and are then dispersed in a solution present in a container to prepare a dispersion 50. The graphene material 11a may be prepared by reducing graphene oxide.

The boron nitride may be synthesized by reacting $B_2O_3$ or $B(OH)_3$ with $NH_3$ or $CO(NH_2)_2$ under a $N_2$ atmosphere at a temperature of 900 to 1,000° C.

When the boron nitride is synthesized as described above, the boron nitride is synthesized in a multilayer structure and is converted into a boron nitride material 15a by milling and then exfoliation so as to constitute a structure having several to several tens of layers.

Meanwhile, the graphene material 11a or the boron nitride material 15a may be used as the heat transfer materials 21 and 31 contained in the adhesive layer 20 and the protective layer 30.

Next, the dispersion 50 in which the graphene material 11a and the boron nitride material 15a thus produced are disposed is dried and rolled to produce a heat discharging layer 10.

A process of producing a film by drying the dispersion 50 may be carried out by two methods as described below.

Figure 14:
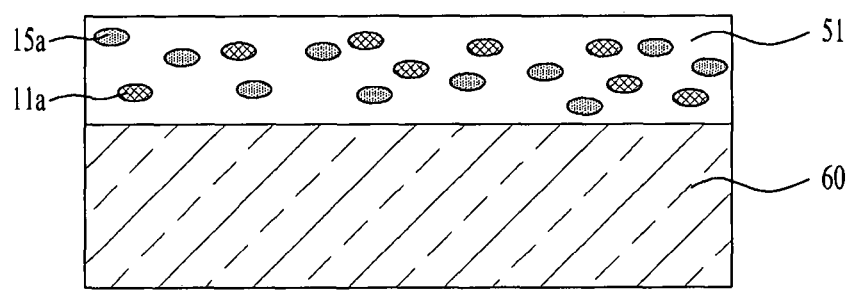

First, as shown in FIG. 14, the dispersion, in which the graphene material 11a and the boron nitride material 15a thus produced are dispersed, is coated on a substrate 60 to produce a film 51.

Figure 15:
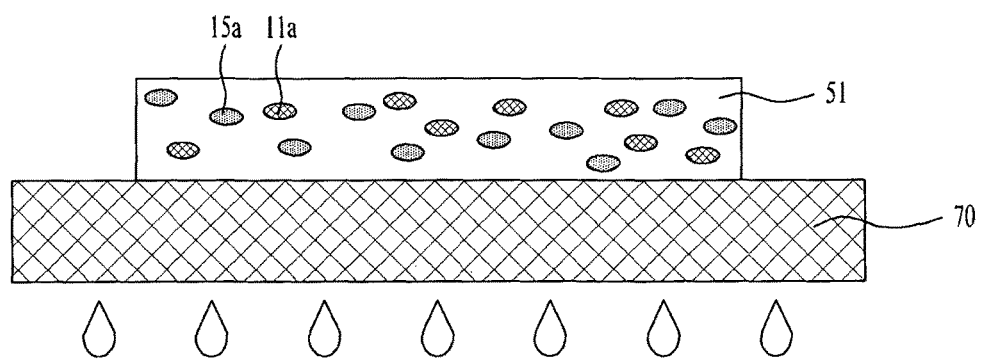

In the other method, as shown in FIG. 15, the film 51 may be produced by filtering the dispersion, in which the graphene material 11a and the boron nitride material 15a are dispersed, using a sieve 70.

Figure 16:
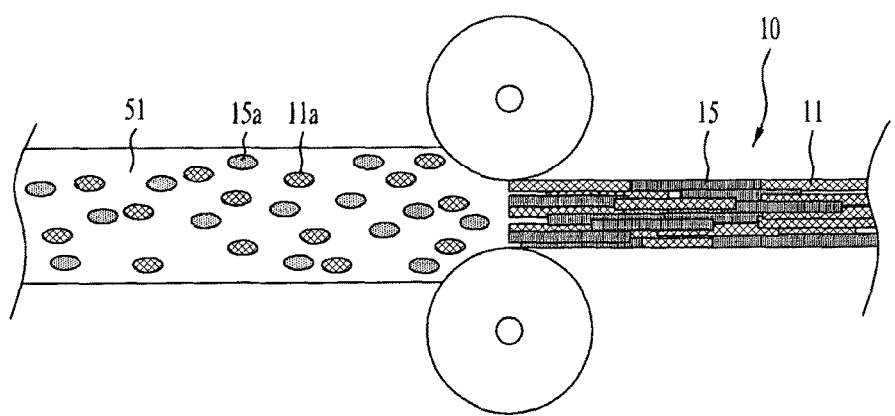

As such, after production of the film 51 using the dispersion 50, as shown in FIG. 16, the film 51 is rolled using a pair of rollers to produce a heat discharging layer 10.

In the rolling process, the graphene material 11a is mixed with the boron nitride material 15a to form a multilayer structure of the graphene 11 and the boron nitride 15.

An adhesive layer 20 and a protective layer 30 are adhered to or are directly formed on the first surface and the second surface, respectively, of the heat discharging layer 10 produced in this process, to manufacture the heat discharging sheet 100 as shown in FIG. 1.

Third Embodiment

Figure 17:
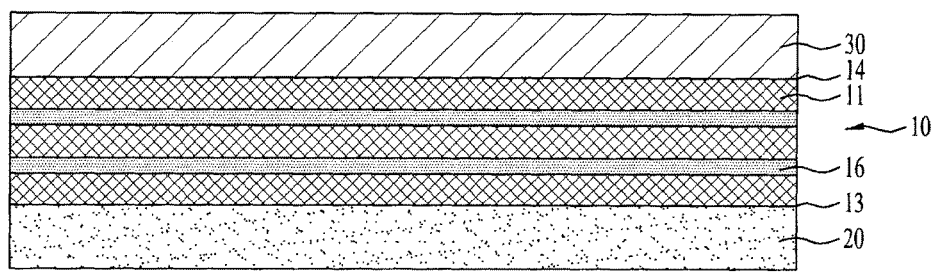
FIGS. 17 to 22 illustrate a third embodiment according to the present invention.

FIG. 17 is a sectional view illustrating a heat discharging sheet according to a third embodiment.

As shown in FIG. 17, the heat discharging sheet 100 includes a heat discharging layer 10 having a first surface 13 and a second surface 14. The heat discharging layer 10 can transfer or discharge heat.

The heat discharging layer 10 has a stack structure in which a plurality of graphene layers 11 and a plurality of thermal conductivity-reinforcing layers 16 for improving thermal conductivity in a vertical direction are stacked. As shown in the drawing, the thermal conductivity-reinforcing layers 16 may be disposed between the graphene layers 11. In this case, the graphene layers 11 may alternate with the thermal conductivity-reinforcing layers 16.

Each of the thermal conductivity-reinforcing layer 16 may include at least one of the metal layer and the inorganic material layer. The thermal conductivity-reinforcing layer 16 may include both the metal layer and the inorganic material layer, and the metal layer and the inorganic material layer may alternate with each other in the stack structure of the heat discharging layer 10. For example, the thermal conductivity-reinforcing layer 16 which is disposed at a first position between the graphene layers 11 may be the metal layer and the thermal conductivity-reinforcing layer 16 which is disposed at a second position between the graphene layers 11 may be the inorganic material layer.

In some cases, the thermal conductivity-reinforcing layer 16 may have a composite layer structure including the metal layer and the inorganic material layer. In this case, the metal layer may be a material such as copper (Cu), aluminum (Al), silver (Ag) and gold (Au), but the present invention is not limited thereto. In addition, the inorganic material layer may include at least one of AlN, $Al_2O_3$, $SiO_2$ and MgO, but the present invention is not limited thereto.

In this case, the heat discharging layer 10 generally has heat conduction and thus uses, as a main material, the graphene 11 with superior thermal conductivity.

The graphene 11 exhibits superior thermal conductivity. However, as described above, graphene has a layered anisotropic arrangement and thus has superior thermal conductivity in a horizontal direction, but has a low thermal conductivity in a vertical direction. However, the thermal conductivity-reinforcing layer 16 having isotropic thermal conductivity and mediating heat conduction in a vertical direction is disposed between the graphene layers 11 and improves thermal conductivity in a vertical direction.

The heat discharging layer 10 may have a thickness of 5 to 100 μm. In order to obtain this thickness, the heat discharging layer 10 may be formed by stacking the graphene layer 11 and the thermal conductivity-reinforcing layer 16.

Meanwhile, an adhesive layer 20 attached to a heat source (200; see FIG. 19) may be disposed on the first surface 13 of the heat discharging layer 10. Such an adhesive layer 20 functions to enhance attachment of the heat discharging layer 10 to the heat source, to minimize the distance between the first surface 13 and the heat source and to effectively transfer heat generated in the heat source to the heat discharging layer 10.

A polymer-based material may be used as a matrix of the adhesive layer 20, but the present invention is not limited thereto. When a polymer material is used as the matrix of the adhesive layer 20, a variety of polymer resins such as a polyurethane resin, an epoxy resin, an acrylic resin and a polymer resin may be used.

The adhesive layer 20 may have a thickness of several tens of nanometers to several hundreds of micrometers and may have a thickness of 5 to 100 μm for effective discharge of heat and adhesion to the heat source.

In addition, a protective layer 30 for protecting the heat discharging layer 10 may be disposed on the second surface 14 of the heat discharging layer 10. The protective layer 30 may be formed by coating on the heat discharging layer 10 to prevent detachment of a material constituting the heat discharging layer 10. However, the protective layer 30 may improve heat discharge property, in addition to serving the anti-detachment function. In addition, in some cases, the protective layer 30 may improve insulation.

That is, the protective layer 30 effectively discharges heat transferred through the heat discharging layer 10 to the outside. The protective layer 30 may be made of a polymer-based material, but the present invention is not limited thereto.

When a polymer material is used for the protective layer 30, a variety of polymer resins such as a polyurethane resin, an epoxy resin, an acrylic resin, a polymer resin, PET and PT may be used.

The protective layer 30 may have a thickness ranging from several tens of nanometers to several hundreds of micrometers in consideration of protection of the heat discharging layer 10 and discharge of heat to the outside. The protective layer 30 may have a thickness of 5 to 100 μm for effective discharge of heat and adhesion to the heat source. More specifically, the protective layer 30 can exert optimal effects when it has a thickness of 5 to 20 μm.

Figure 18:
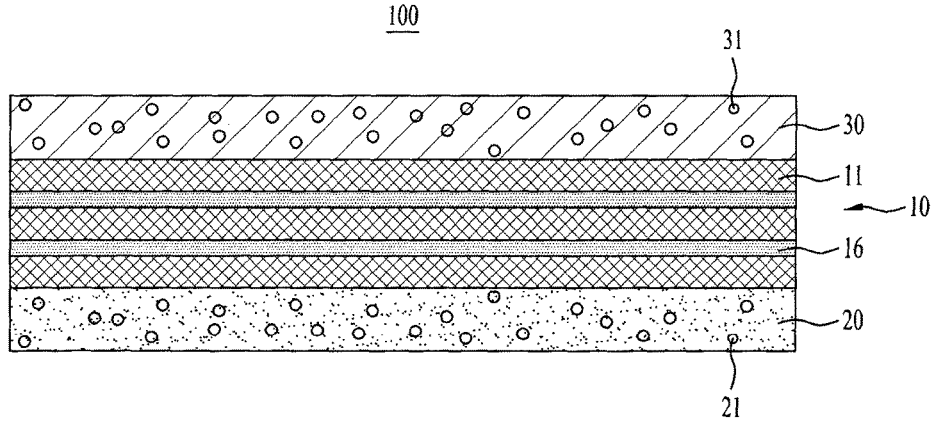

Meanwhile, as shown in FIG. 18, for improvement of heat conduction, a thermally conductive material 21 or 31 may be contained in at least one of the adhesive layer 20 and the protective layer 30. The characteristics of the conduction materials 21 and 31 are the same as those of the embodiment described above.

Figure 19:
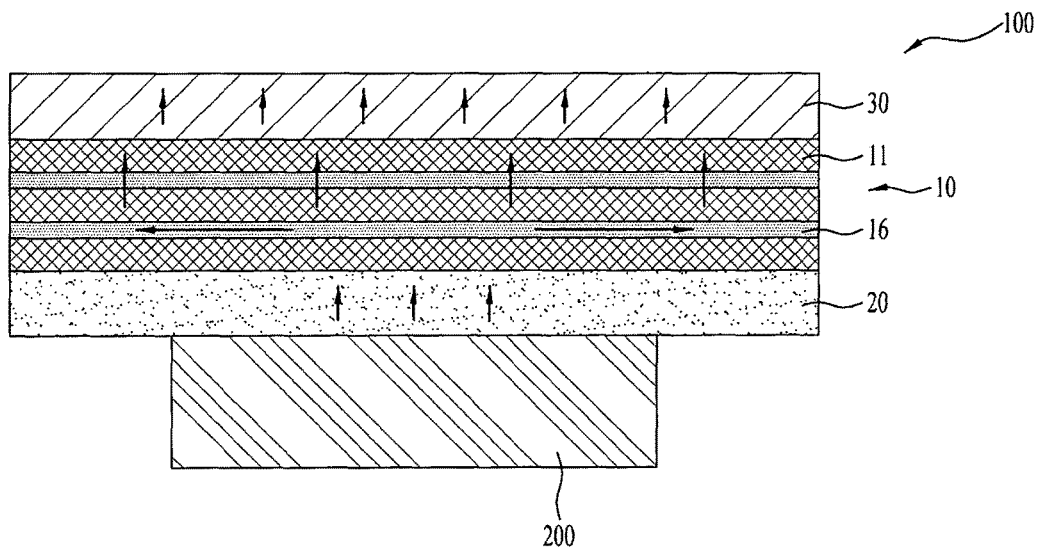

FIG. 19 schematically shows discharge of heat by a heat discharging sheet attached to a heat source. As described above, the heat discharging sheet 100 is attached to the heat source 200 and effectively discharges heat generated by the heat source 200.

The heat discharging layer 10 including the graphene 11 and the thermal conductivity-reinforcing layer 16 which are stacked is attached to the heat source 200 and discharges heat generated by the heat source 200. In this case, the adhesive layer 20 is attached to the heat source 200 and effectively transfers heat generated by the heat source 200 to the heat discharging layer 10.

Contents not described herein may be the same as those of other embodiments described above or below.

Figure 20:
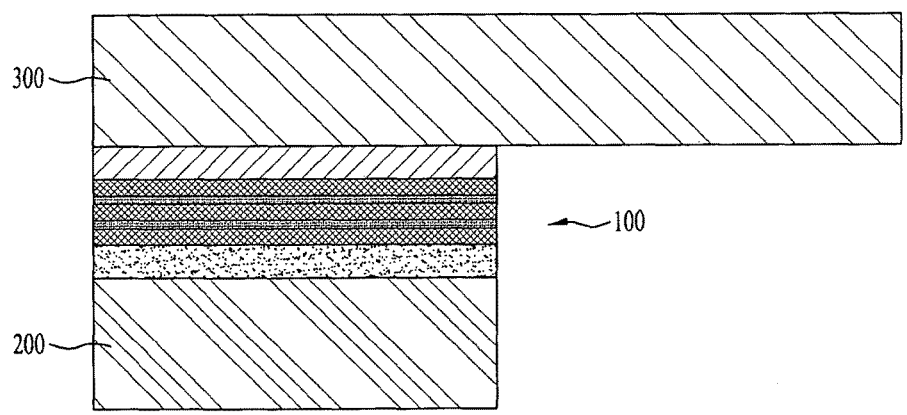

FIG. 20 shows an example of use of the heat discharging sheet and an example in which the heat discharging sheet 100 is used for application products such as TVs using flat panel displays.

Hereinafter, a method for manufacturing the heat discharging layer 10 of the heat discharging sheet 100 will be described in detail with reference to FIGS. 21 to 22.

Figure 21:
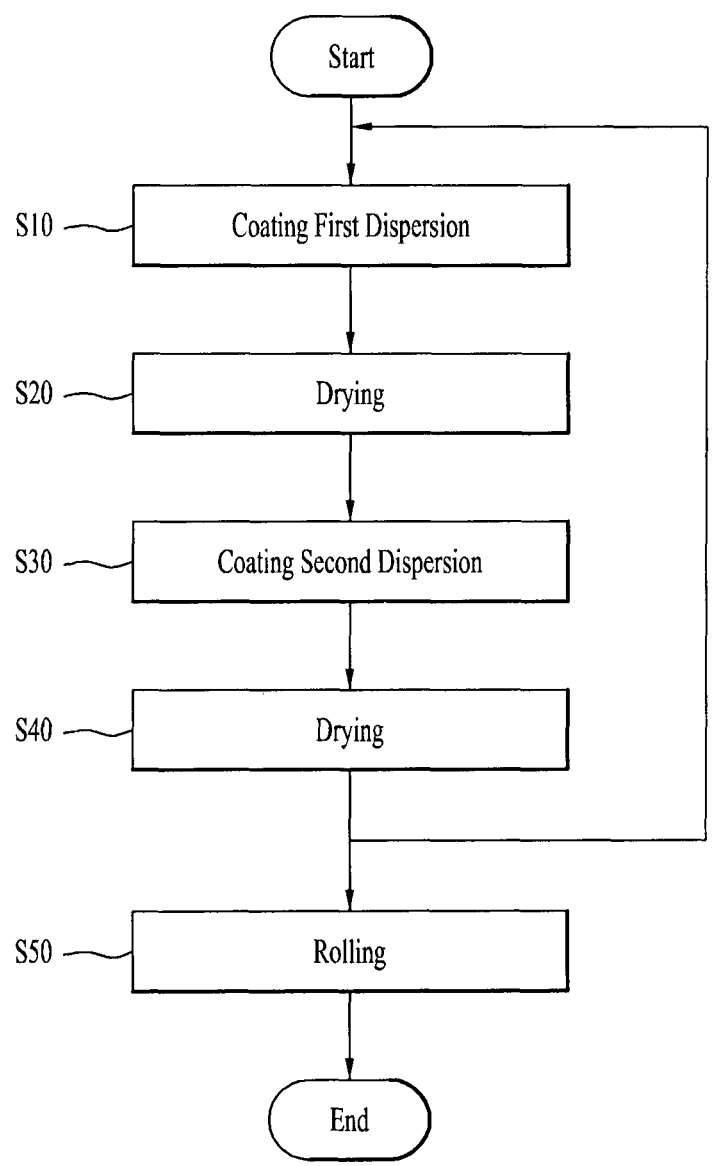

First, as shown in FIG. 21, a heat discharging layer 10 may be produced by alternately coating a dispersion and drying the same. For this purpose, a graphene material, a metal and an inorganic material are prepared and are then dispersed in a solution present in a container to prepare a dispersion. That is, a first dispersion, in which a graphene material is dispersed, and a second dispersion, in which a material for the heat conduction reinforcing layer such as a metal and an inorganic material are dispersed, are prepared. In this case, the graphene material may be produced by reducing graphene oxide.

The first dispersion thus prepared, in which the graphene material is dispersed, is coated on a substrate (S10).

Then, the first dispersion is dried (S20) to form a film of the first dispersion.

Then, the second dispersion, in which the metal and the inorganic material are dispersed, is coated on the film of the first dispersion (S30).

In addition, the second dispersion is dried (S40) to form a film of the second dispersion.

As a result, a graphene layer is formed by the film of the first dispersion and a heat conduction reinforcing layer including the metal or the inorganic material is formed by the film of the second dispersion on the graphene layer.

The step of coating and drying the first dispersion and the step of coating and drying the second dispersion (S10 to S40) may be repeated. Through repetition of the steps, the graphene layer and the heat conduction reinforcing layer constitute a multilayer structure.

Then, the multilayer structure is rolled (S50) to produce a heat discharging layer.

Figure 22:
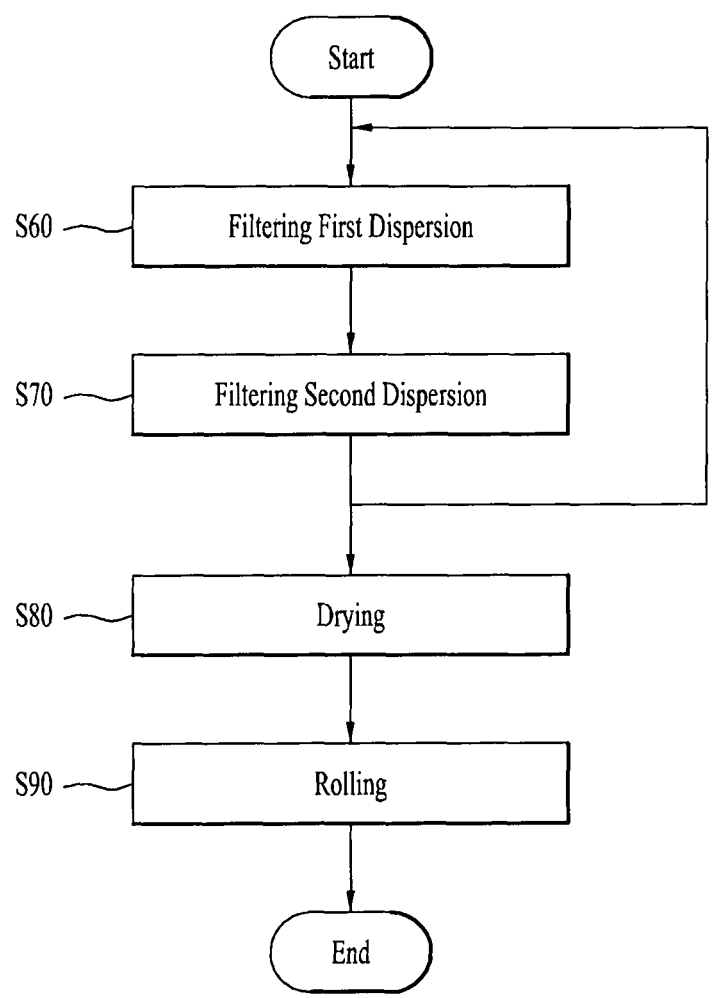

Meanwhile, as shown in FIG. 22, the heat discharging layer 10 may be produced by alternately filtering the dispersions, followed by drying.

For this purpose, a graphene material, a metal and an inorganic material are prepared and are then dispersed in a solution present in a container to prepare dispersions. That is, a first dispersion, in which a graphene material is dispersed, and a second dispersion, in which a metal and an inorganic material are dispersed, are prepared. In this case, as described above, the graphene material may be produced by reducing graphene oxide.

First, the first dispersion thus prepared is filtered through a sieve such as filtering apparatus (S60).

Then, after a film is formed by filtering the first dispersion, the second dispersion is filtered on the film of the first dispersion (S70).

The step of filtering the first dispersion and the step of filtering the second dispersion may be repeated. That is, after a film of the second dispersion is formed by filtering the second dispersion on the film of the first dispersion, the first dispersion is filtered again on the film of the second dispersion to form a multilayer including a plurality of films of the first dispersion and the film of the second dispersion.

Then, the film of the first dispersion and the film of the second dispersion are dried (S80).

The dried multilayer structure is rolled (S90) to produce a heat discharging layer.

Fourth Embodiment

Figure 23:
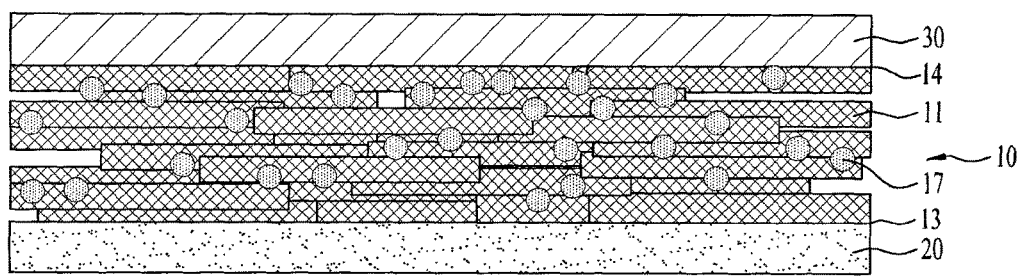
FIGS. 23 to 28 illustrate a fourth embodiment according to the present invention.

FIG. 23 is a sectional view illustrating a heat discharging sheet according to a fourth embodiment.

As shown in FIG. 23, the heat discharging sheet 100 includes a heat discharging layer 10 having a first surface 13 and a second surface 14. The heat discharging layer 10 may transfer or discharge heat. The heat discharging layer 10 includes a graphene 11 and inorganic particles 17.

The graphene 11 has a two-dimensional layered structure and the inorganic particles 17 are distributed between layers of the graphene 11 and mediate heat conduction through the respective layers of the graphene 11. Accordingly, the inorganic particles 17 may be distributed between the layers of the graphene 11. In this case, the heat discharging layer 10 generally has heat conduction and thus uses, as a main material, the graphene 11 with superior thermal conductivity.

The graphene 11 exhibits superior thermal conductivity. However, as described above, graphene has a layered anisotropic arrangement and thus has superior thermal conductivity in a horizontal direction, but has low thermal conductivity in a vertical direction. However, inorganic particles 17 having isotropic thermal conductivity are distributed between the layers of the graphene 11 and improves thermal conductivity in a vertical direction.

For this purpose, the content of the inorganic particles 17 may be 0.5 to 50% by weight and the content of the graphene 11 may be 50 to 99.5% by weight.

The heat discharging layer 10 may have a thickness of 5 to 100 µm. In order to obtain this thickness, layers of the graphene 11 are stacked and the inorganic particles 17 are distributed between the layers of the graphene 11.

Meanwhile, an adhesive layer 20 attached to a heat source (200; see FIG. 3) may be disposed on the first surface 13 of the heat discharging layer 10. Such an adhesive layer 20 functions to enhance attachment of the heat discharging layer 10 to the heat source, to minimize the distance between the first surface 13 and the heat source and to effectively transfer heat generated in the heat source to the heat discharging layer 10. A polymer-based material may be used as a matrix of the adhesive layer 20, but the present invention is not limited thereto.

When a polymer material is used as the matrix of the adhesive layer 20, a variety of polymer resins such as a polyurethane resin, an epoxy resin, an acrylic resin and a polymer resin may be used.

The adhesive layer 20 may have a thickness of several tens of nanometers to several hundreds of micrometers and may have a thickness of 5 to 100 µm for effective discharge of heat and adhesion to the heat source.

More specifically, when the adhesive layer 20 has a thickness of 5 to 20 µm, optimal effects can be exerted.

In addition, a protective layer 30 for protecting the heat discharging layer 10 may be disposed on the second surface 14 of the heat discharging layer 10. The protective layer 30 may be formed on the heat discharging layer 10 by coating to prevent detachment of a material constituting the heat discharging layer 10. However, the protective layer 30 may improve heat discharge property, in addition to serving the anti-detachment function. In addition, in some cases, the protective layer 30 may improve insulation.

That is, the protective layer 30 effectively discharges heat transferred through the heat discharging layer 10. The protective layer 30 may be made of a polymer-based material, but the present invention is not limited thereto. When a polymer material is used for the protective layer 30, a variety of polymer resins such as a polyurethane resin, an epoxy resin, an acrylic resin, a polymer resin, PET and PT may be used.

The protective layer 30 may have a thickness ranging from several tens of nanometers to several hundreds of micrometers in consideration of protection of the heat discharging layer 10 and discharge of heat to the outside. The protective layer 30 may have a thickness of 5 to 100 µm for effective discharge of heat and adhesion to the heat source. More specifically, the protective layer 30 can exert optimal effects when it has a thickness of 5 to 20 µm.

Figure 24:
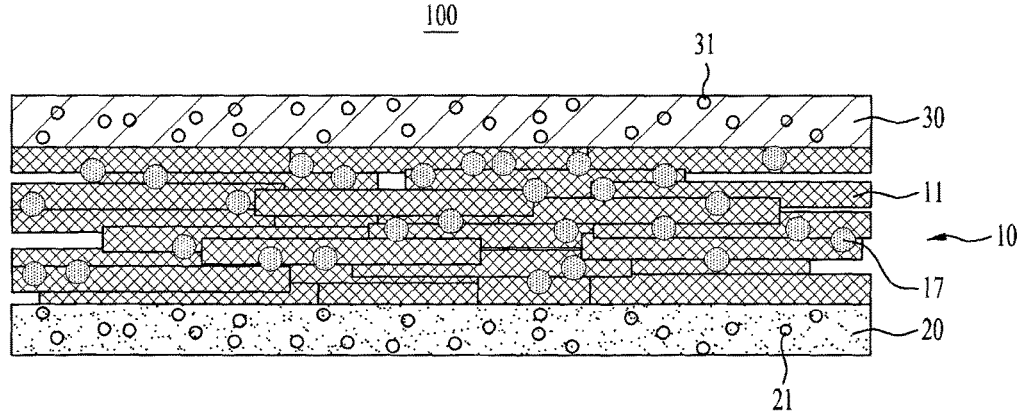

Meanwhile, as shown in FIG. 24, for improvement of heat conduction, a thermal conductive material 21 or 31 may be contained in at least one of the adhesive layer 20 and the protective layer 30. The characteristics of the conduction materials 21 and 31 are the same as those of the embodiment described above or below.

Figure 25:
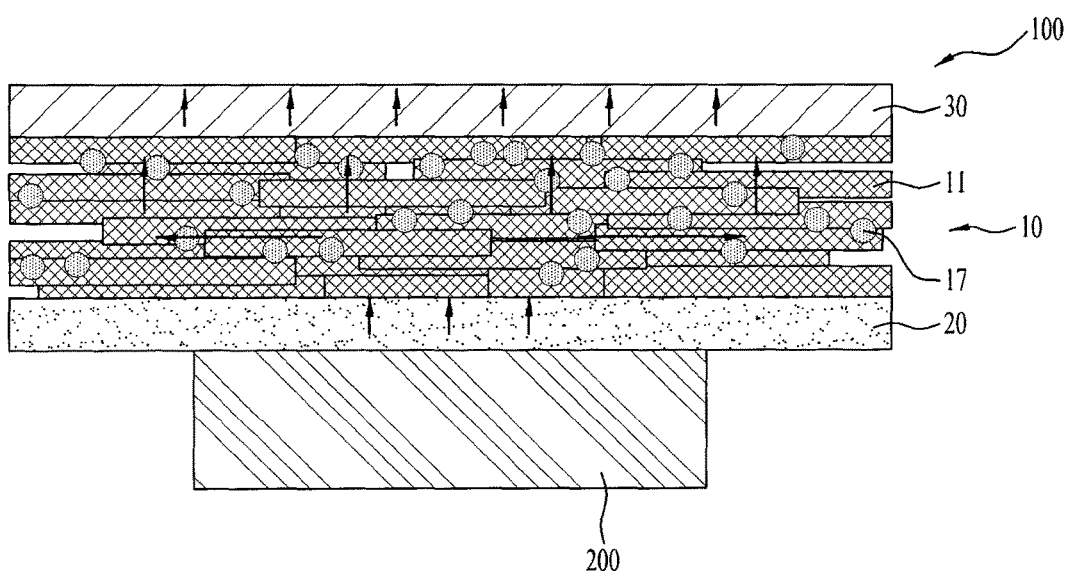

FIG. 25 schematically shows discharge of heat by a heat discharging sheet attached to a heat source. As described above, the heat discharging sheet 100 is attached to the heat source 200 and effectively discharges heat generated by the heat source 200.

The heat discharging layer 10 including the graphene 11 and the inorganic particles 17 is attached to the heat source 200 and discharges heat generated by the heat source 200. In this case, the adhesive layer 20 is adhered to the heat source 200 and effectively transfers heat generated by the heat source 200 to the heat discharging layer 10.

As described above, the graphene 11 is composed of carbon atoms having a hexagonal single layer and is rich in π-electrons in the plane and thus has superior thermal conductivity and electrical conductivity. The graphene 11 has a considerably high thermal conductivity of about 3,000 to about 5,000 W/mK and effectively discharges heat transferred from the heat source through the heat discharging layer 10, in particular, in a lateral direction.

The graphene 11 is produced by stacking a powder obtained from graphene oxide and compressing the powder and thus has an anisotropic arrangement and has considerably high thermal conductivity in a horizontal direction of 300 to 1,000 W/mK, but has a relatively low thermal conductivity (2 to 5 W/mk) in a vertical direction.

In this case, the inorganic particles 17 disposed between the graphenes 11 may be connected to the graphene 11 to enable heat conduction through the respective layers of the graphene 11. Accordingly, thermal conductivity in a vertical direction can be greatly improved.

The inorganic particles 17 can greatly improve thermal conductivity in a vertical direction by heat transfer via phonons. That is, when gaps are present between the layers of the graphene 11, heat transfer through phonons may be not easy and the inorganic particles 17 act as substances transferring heat between the layers and facilitate heat transfer via phonons.

The connection structure between the inorganic particles 17 and the graphenes 11 improves thermal conductivity in a vertical direction to about several to about several tens of W/mK.

The inorganic particles 17 may be h-BN, SiC, AlN, $Al_2O_3$, $SiO_2$, MgO and the like, but the present invention is not limited thereto.

Of these, h-BN (hexagonal boron nitride) has a thermal conductivity of about 600 W/mK and SiC has a thermal conductivity of about 7 to 12 W/mK. In addition, AlN, $Al_2O_3$ and MgO have a thermal conductivity of about 19 W/mK, 24 to 35 W/mK and 45 to 60 W/mK, respectively.

Accordingly, inorganic particles 17 may be designed by selecting a material having the corresponding thermal conductivity according to application of the heat discharging sheet 100. In some cases, such a material may be used in combination.

Meanwhile, as described above, when the heat transfer material 21 is contained in the adhesive layer 20, heat generated by the heat source 200 can be more effectively transferred to the heat discharging layer 10 because of superior thermal conductivity of the heat transfer material 21.

The heat discharging layer 10 can discharge heat, in particular, in a lateral direction and can thus more effectively discharge heat generated by the heat source 200. In this case, the heat transferred to the protective layer 30 may be discharged to the outside through the protective layer 30. In addition, when the heat transfer material 31 is contained in the protective layer 30, heat can be effectively discharged through the protective layer 30 due to superior thermal conductivity of the heat transfer material 31. In addition, heat exchange with the exterior air through the protective layer 30 may also proceed.

Commonly, the adhesive layer 20a and the protective layer 30 contain an oxide filler for improvement of thermal conductivity, but the oxide filler should be contained in a large amount in order to improve the thermal conductivity to a predetermined level due to great weight and low thermal conductivity and is disadvantageously difficult to apply to products having a thickness of about several to about several tens of micrometers.

However, the adhesive layer 20 or the protective layer 30 including the heat transfer material 21 or 31 can more effectively transfer or discharge heat without causing these problems.

Figure 26:
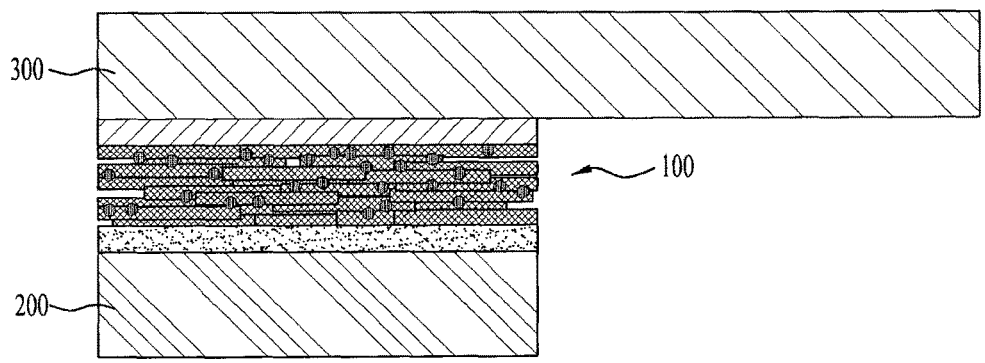

FIG. 26 shows an example of use of the heat discharging sheet and an example in which the heat discharging sheet 100 is used for application products such as TVs using flat panel displays.

Figure 27:
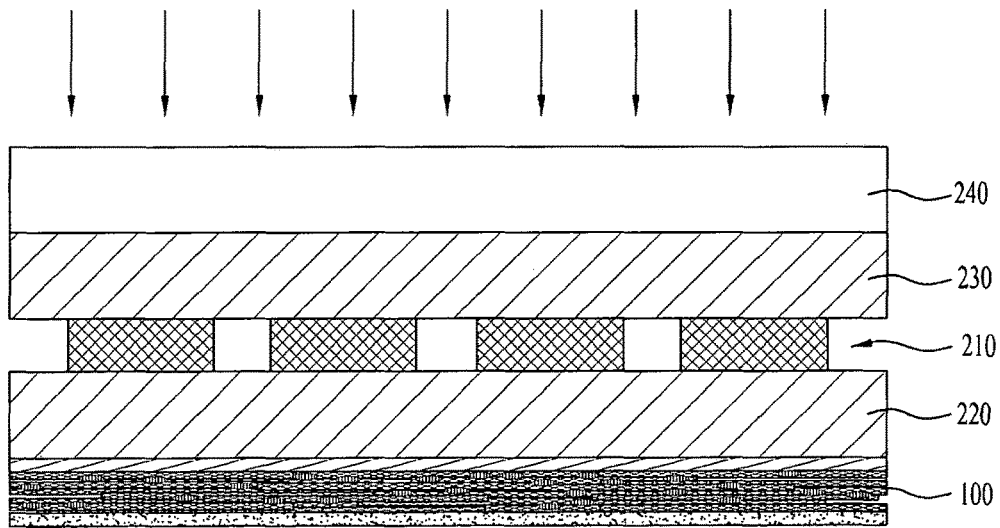
Figure 28:
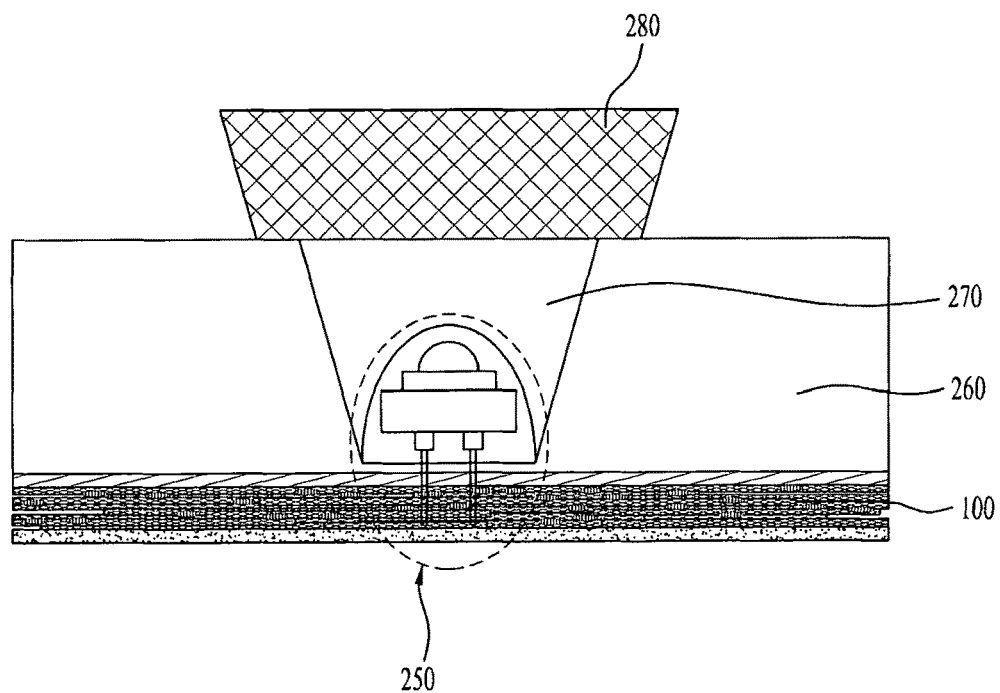

Meanwhile, as shown in FIGS. 27 and 28, the heat discharging sheet 100 may be used for a solar cell and a light-emitting diode lighting device.

FIG. 27 shows an example in which the heat discharging sheet 100 described above is used as the heat source 200 for a solar cell. The solar cell 210 is provided between a lower buffer member 220 and an upper buffer member 230. The solar cell 210 converts light incident through a transparent substrate 240 into electrical energy.

This energy conversion process of converting heat energy into electrical energy has a limited efficiency and a predetermined amount of the energy is thus discharged as heat. Accordingly, it is important to effectively discharge heat. In this case, by adhering the heat discharging sheet 100 to a lower part of the lower buffer member 220, the heat that may be generated in the energy conversion process can be effectively discharged through the heat discharging sheet 100.

FIG. 28 shows an example in which the heat discharging sheet is used for a light-emitting diode lighting device.

Recently, the light-emitting diode is increasingly used. In particular, the light-emitting diode is used as a lamp that may replace conventional lamps such as fluorescent lamps and incandescent lamps, and as a lighting device using the same. The light-emitting diode functions to convert electrical energy into light energy, on the contrary to the solar cell. In this case, too, the energy conversion process has a limited efficiency and a predetermined amount of energy is thus discharged as heat.

Accordingly, it may be important to effectively discharge heat emitted from a light-emitting diode package 250 by adhering the heat discharging sheet 100 to a lower part of the light-emitting diode package 250 used for the light-emitting diode lighting.

The reason for this is that lifespan of chips of the light-emitting diode can be lengthened by heat discharge and the entire heat generated by the lighting device can be reduced.

The light-emitting diode package 250 is mounted on a case 260, and a lens unit 270 and a light guide unit 280 are provided on the light-emitting diode package 250. For this reason, the light-emitting diode package 250 has a structure in which discharge of heat to a front part is difficult. Accordingly, the heat discharging sheet 100 may be provided by thermally connecting the lower part of the light-emitting diode package 250. In this case, the light-emitting diode package 250 is generally provided at the lower part thereof with a heat sink and the heat discharging sheet 100 may be thus directly adhered to the heat sink.

Meanwhile, the heat discharging sheet 100 may be adhered to and used for any area where heat may be generated.

A process of manufacturing the heat discharging sheet 100 may be the same as described in the afore-mentioned embodiment. For example, a process of manufacturing the heat discharging sheet 100 may be performed using inorganic materials 17, instead of the metal particles 12 shown in FIGS. 5 to 8 and description associated therewith.

Fifth Embodiment

Figure 29:
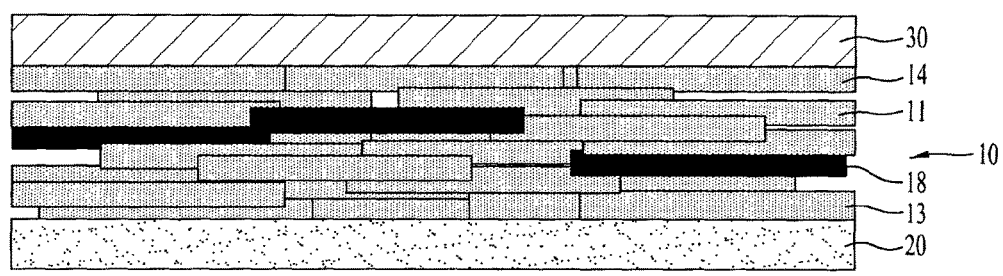
FIGS. 29 to 32 illustrate a fifth embodiment according to the present invention.

FIG. 29 is a sectional view illustrating a heat discharging sheet according to a fifth embodiment.

As shown in FIG. 29, the heat discharging sheet 100 includes a heat discharging layer 10 having a first surface 13 and a second surface 14. The heat discharging layer 10 may transfer or discharge heat. The heat discharging layer 10 includes a graphene 11 and a strength-reinforcing material 18.

The graphene 11 contained in the heat discharging layer 10 forms a multilayer structure. The heat discharging layer 10 may have a low strength. For this reason, the heat discharging layer 10 may include a strength-reinforcing material 18 to reinforce the strength of the heat discharging layer 10 upon adhesion to the heat source. The strength-reinforcing material 18 may include at least one of carbon nanotubes and carbon fibers.

The content of the strength-reinforcing material 18 may be 1 to 50% by weight and the content of the graphene 11 may be 50 to 99% by weight.

In addition, as described above, the graphene 11 constitutes a two-dimensional layered structure. The strength-reinforcing material 18 is distributed between layers of the graphene 11 and mediates heat conduction through respective layers of the graphene 11. Accordingly, the strength-reinforcing material 18 may be distributed between the layers of the graphene 11.

In this case, the heat discharging layer 10 generally has heat conduction and thus uses, as a main material, the graphene 11 with superior thermal conductivity. The heat discharging layer 10 may have a thickness of 5 to 100 µm. In order to obtain this thickness, the heat discharging layer 10 may be formed by stacking the graphene 11 and the strength-reinforcing material 18.

Meanwhile, an adhesive layer 20 attached to a heat source (200; see FIG. 3) may be disposed on the first surface 13 of the heat discharging layer 10. Such an adhesive layer 20 functions to enhance attachment of the heat discharging layer 10 to the heat source, to minimize the distance between the first surface 13 and the heat source and to effectively transfer heat generated in the heat source to the heat discharging layer 10. A polymer-based material may be used as a matrix of the adhesive layer 20, but the present invention is not limited thereto.

In addition, a protective layer 30 for protecting the heat discharging layer 10 may be disposed on the second surface 14 of the heat discharging layer 10. The protective layer 30 may be formed by coating on the heat discharging layer 10 to prevent detachment of a material constituting the heat discharging layer 10. However, the protective layer 30 may improve heat discharge property, in addition to serving the anti-detachment function. In addition, in some cases, the protective layer 30 may improve insulation. That is, the protective layer 30 effectively discharges heat transferred through the heat discharging layer 10 to the outside.

The protective layer 30 may be made of a polymer-based material, but the present invention is not limited thereto.

When a polymer material is used for the protective layer 30, a variety of polymer resins such as a polyurethane resin, an epoxy resin, an acrylic resin, a polymer resin, PET and PT may be used.

The protective layer 30 may have a thickness ranging from several tens of nanometers to several hundreds of micrometers in consideration of protection of the heat discharging layer 10 and discharge of heat to the outside. The protective layer 30 may have a thickness of 5 to 100 µm for effective discharge of heat and adhesion to the heat source.

More specifically, the protective layer 30 can exert optimal effects when it has a thickness of 5 to 20 µm.

Figure 30:
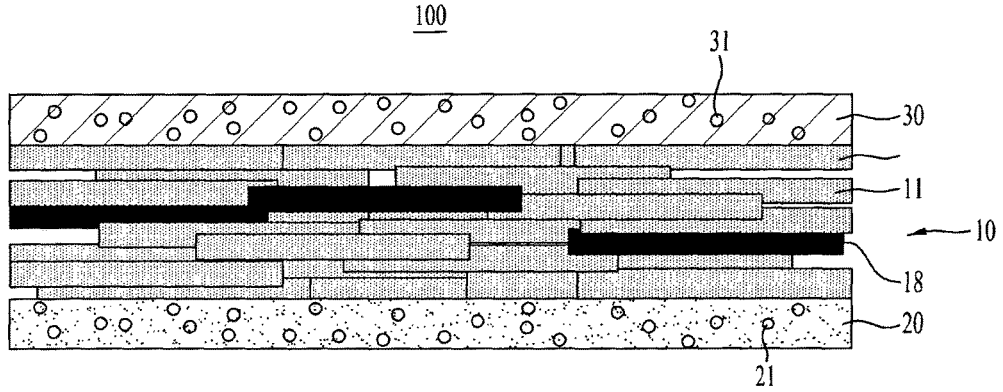

Meanwhile, as shown in FIG. 30, for improvement of heat conduction, a thermally conductive material 21 or 31 may be contained in at least one of the adhesive layer 20 and the protective layer 30. The characteristics of the conduction materials 21 and 31 are the same as those described above or below.

Figure 31:
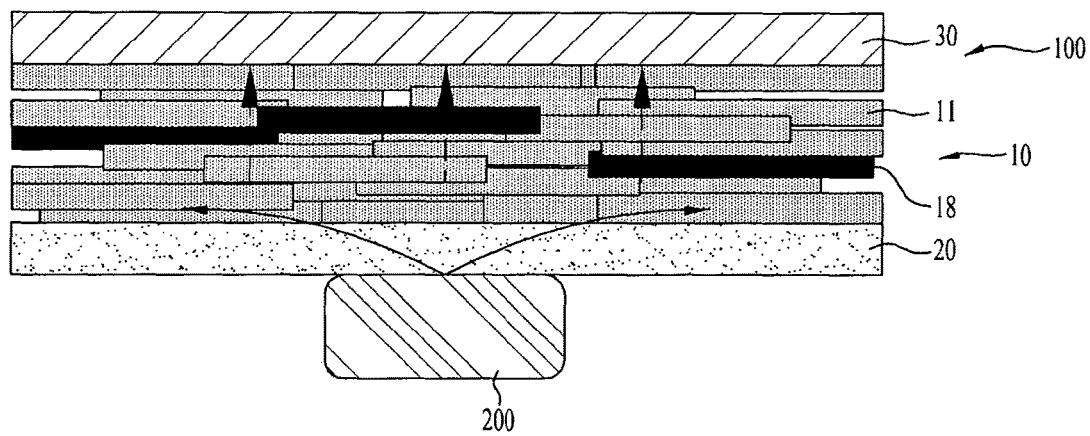

FIG. 31 schematically shows discharge of heat by a heat discharging sheet attached to a heat source. As described above, the heat discharging sheet 100 is attached to the heat source 200 and effectively discharges heat generated by the heat source 200.

The heat discharging layer 10 including the graphene 11 and the strength-reinforcing material 18 is attached to the heat source 200 and discharges heat generated by the heat source 200. In this case, the adhesive layer 20 is attached to the heat source 200 and effectively transfers heat generated by the heat source 200 to the heat discharging layer 10.

As described above, the graphene 11 is composed of carbon atoms having a hexagonal single layer and is rich in π-electrons in the plane and thus has superior thermal conductivity and electrical conductivity.

However, because the graphene 11 is thin and weak, the heat discharging layer 10 may be defected, for example, broken, folded and wrinkled, upon adhesion to the heat source 200. In addition, great damage may be generated upon manufacture of products due to this phenomenon.

In order to solve this phenomenon, strength can be improved by adding the strength-reinforcing material 18 such as linear carbon nanotubes (CNTs) or carbon fibers.

Furthermore, the strength-reinforcing material 18 disposed between layers of the graphene 11 may be connected to the layers of the graphene 11 to enable heat conduction through respective layers of the graphene 11. Accordingly, thermal conductivity in a vertical direction can be greatly improved.

That is, the graphene 11 has low thermal conductivity in a vertical direction, of 2 to 5 W/mK, as compared to thermal conductivity in a horizontal direction, but the strength-reinforcing material 18 is disposed between layers of the graphene 11 and thereby reinforces thermal conductivity in a vertical direction.

As described above, when carbon nanotubes (CNTs) or carbon fibers are used as the strength-reinforcing material 18, thermal conductivity in a vertical direction can be improved to about 1 to about 10 W/mK through connection of the strength-reinforcing material 18 to the graphene 11.

Meanwhile, as described above, when the heat transfer material 21 is contained in the adhesive layer 20, heat generated by the heat source 200 can be more effectively transferred to the heat discharging layer 10 because of superior thermal conductivity of the heat transfer material 21.

Figure 32:
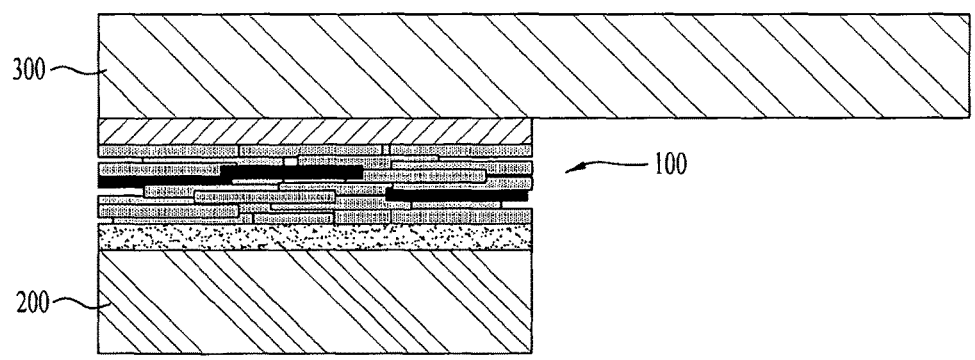

FIG. 32 shows an example of use of the heat discharging sheet and an example in which the heat discharging sheet 100 is used for application products such as TVs using flat panel displays.

The heat discharging sheet 100 may be used for a solar cell and a light-emitting diode lighting device.

A process of manufacturing the heat discharging sheet 100 may be the same as that of the first embodiment. For example, a process of manufacturing the heat discharging sheet 100 may be performed using a material for the strength-reinforcing and the strength-reinforcing material 18, instead of the boron nitride material 15a and the boron nitride 15 shown in FIGS. 13 to 16 and description associated therewith.

Elements not described herein are the same as those of the embodiment described above.

INDUSTRIAL APPLICABILITY

The present invention provides a heat discharging sheet to effectively discharge heat generated by a heat source such as a flat panel display, a solar cell and a light-emitting diode lighting device in lateral and vertical directions and a method for manufacturing the same.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A heat discharging sheet comprising:
a heat discharging layer having a first surface and a second surface, the heat discharging layer comprising graphene and metal particles, wherein the graphene is arranged in a layered anisotropic arrangement, and wherein the metal particles having isotropic thermal conductivity are distributed between layers of the graphene so as to improve thermal conductivity in a vertical direction of the heat discharging sheet with respect to the layered anisotropic arrangement;
an adhesive layer disposed on the first surface of the heat discharging layer, wherein the adhesive layer comprises a thermally conductive material; and
a protective layer disposed on the second surface of the heat discharging layer, and including a thermally conductive material,
wherein the graphene has a two-dimensional layered structure, and
wherein the thermally conductive material of the adhesive layer comprises at least one of Cu, Al, BN, AiN, $Al_2O_3$, MgO and carbon nanotubes (CNTs).

2. The heat discharging sheet according to claim 1, wherein the metal particles are present in an amount of 0.5, to 50% by weight of the heat discharging layer and the graphene is present in an amount of 50 to 99.5% by weight of the heat discharging layer.

3. The heat discharging sheet according to claim 1, wherein the metal particles comprise at least one of copper (Cu), silver (Ag), aluminum (Al) and gold (Au).

4. The heat discharging sheet according to claim 1, wherein the thermally conductive material is present in an amount of 10 to 90% by weight in the adhesive layer or the protective layer.

5. The heat discharging sheet according to claim 1, wherein at least one of the adhesive layer and the protective layer comprises a polymer material.

6. The heat discharging sheet according to claim 1, wherein at least one of the adhesive layer and the protective layer has a thickness of 5 to 20 μm.

7. The heat discharging sheet according to claim 1, wherein the heat discharging layer includes:
the layers of the graphene which are stacked.

8. The heat discharging sheet according to claim 1, wherein the protective layer discharges heat transferred through the heat discharging layer.

9. The heat discharging sheet according to claim 1, wherein the protective layer includes a polymer-based material.

10. The heat discharging sheet according to claim 9, wherein the polymer-based material includes one of a polyurethane resin, an epoxy resin, an acrylic resin, a polymer resin, PET and PT.

11. A heat discharging sheet comprising:
a heat discharging layer having a first surface and a second surface, the heat discharging layer comprising graphene and boron nitride, wherein the graphene and the boron nitride have a layered structure, and wherein the heat discharging layer has a structure in which the graphene and the boron nitride, each having the layered structure, are irregularly stacked so as to secure electrical insulation;
an adhesive layer disposed on the first surface of the heat discharging layer, wherein the adhesive layer comprises a thermally conductive material; and
a protective layer disposed on the second surface of the heat discharging layer, and including the thermally conductive material,
wherein the thermally conductive material comprises at least one of Cu, Al, BN, AiN, $Al_2O_3$, MgO and carbon nanotubes (CNTs).

12. The heat discharging sheet according to claim 11, wherein the boron nitride is present in an amount of 1 to 95% by weight of the heat discharging layer and the graphene is present in an amount of 5 to 99% by weight of the heat discharging layer.

13. The heat discharging sheet according to claim 11, wherein at least one of the adhesive layer and the protective layer comprises a polymer material.

14. The heat discharging sheet according to claim 11, wherein at least one of the adhesive layer and the protective layer has a thickness of 5 to 20 μm.

* * * * *